United States Patent [19]

Hamadah et al.

[11] Patent Number: 5,063,476

[45] Date of Patent: Nov. 5, 1991

[54] APPARATUS FOR CONTROLLED AIR-IMPINGEMENT MODULE COOLING

[75] Inventors: Talal T. Hamadah, Littleton, Mass.; Douglas N. Ryder, Amherst, N.H.; Harvey S. Friedman, Sudbury, Mass.

[73] Assignee: Digital Equipment Corporation, Maynard, Mass.

[21] Appl. No.: 446,258

[22] Filed: Dec. 5, 1989

[51] Int. Cl.⁵ .............................................. H02B 1/00
[52] U.S. Cl. .................................................... 361/384
[58] Field of Search ............ 174/252, 35 R; 361/380, 361/381, 383, 384, 386, 388, 389, 424, 382, 385; 357/81, 82; 165/104.33, 80.3

[56] References Cited

U.S. PATENT DOCUMENTS

| | | |
|---|---|---|
| 3,843,910 | 10/1974 | Riguet . |
| 4,233,644 | 11/1980 | Hwang et al. . |
| 4,277,816 | 7/1981 | Dunn et al. . |
| 4,291,364 | 9/1981 | Andros et al. . |
| 4,296,455 | 10/1981 | Leaycraft et al. . |
| 4,417,295 | 11/1983 | Stuckert . |
| 4,449,164 | 5/1984 | Carlson et al. . |
| 4,489,363 | 12/1984 | Goldberg . |
| 4,494,171 | 1/1985 | Bland et al. . |
| 4,513,351 | 4/1985 | Davis et al. . |
| 4,546,405 | 10/1985 | Hultmark et al. . |
| 4,620,216 | 10/1986 | Horvath . |
| 4,674,004 | 6/1987 | Smith et al. . |
| 4,740,866 | 4/1988 | Kajiwara et al. . |
| 4,750,086 | 6/1988 | Mittal . |
| 4,768,581 | 9/1988 | Gotwald et al. . |
| 4,783,721 | 11/1988 | Yamamoto et al. . |
| 4,851,965 | 7/1989 | Gabuzda et al. ................... 361/383 |

OTHER PUBLICATIONS

IBM Technical Disclosure Bulletin vol. 27, No. 78 Dec. 1984 "Brzyski, Grenchus, Rathod and Stutzman".

*Primary Examiner*—Leo P. Picard
*Assistant Examiner*—Donald A. Sparks
*Attorney, Agent, or Firm*—Cesari & McKenna

[57] ABSTRACT

A modularized air-impingement cooling apparatus is provided for removing heat from integrated circuit components mounted to a circuit board configured for insertion into a computer backplane. In general, pin-fin designed heat sinks are attached to the electronic components requiring heat removal. First and second baffle members are attached in spaced relation to the circuit board and to one another for defining adjacent inlet and exhaust plenums, with multi-jet nozzle arrays admitting air between the two. Walls surround the components to thermally isolate one component from another and to define pockets in flow communication with the exhaust plenum. An air-moving device is utilized to draw air into the inlet plenum which air is then directed through the nozzles to the components to remove heat therefrom and from the pockets, which spent air is then exhausted through the exhaust plenum.

35 Claims, 6 Drawing Sheets 5,063,476

APPARATUS FOR CONTROLLED AIR-IMPINGEMENT MODULE COOLING

FIELD OF THE INVENTION

The invention relates to an air-impingement cooling apparatus for cooling electronic components and more specifically, for cooling high powered, very large scale integration (VLSI) circuit components.

BACKGROUND OF THE INVENTION

The data processing power and speed of modern computer systems depend to a great degree on the efficient control and removal of heat energy from the computer's electronic components. This problem becomes even more significant in light of improvements in the emitter-coupled logic (ECL) and complementary metal-oxide semiconductor (CMOS) integrated circuit fabrication processes, resulting in VLSI components that typically generate large amounts of heat. The heat dissipated by these components, if not effectively controlled and removed, could severely reduce the reliability of the components and systems.

While control and removal of heat energy relates dramatically to computer operation, this problem also has substantial bearing in other electronic component applications having critical reliability requirements, for example in the area of avionics, aerospace and the military.

The use of air flow, whether natural or driven, is a simple and traditional means of cooling. The principle of mass flow of air, where a cool air stream is blown or drawn across the surface of heat-generating components, results in the layer of air closest to the hot surfaces accepting heat from the components and displacing it. For many mass air flow cooling methods, much of the air stream does not significantly contribute to the heat removal process. The air movement device, such as a fan, pushes more air than is useful in the process, resulting in an inefficient method. Consequently, the harnessing of air flow to maximum efficiency would effect significant improvement in the design and operation of the cooling process.

Prior attempts to improve the efficiency of air flow cooling include air impingement designs. Air impingement implies the directing of cooling air onto heat generating objects by means of channeling or air ducting. Such air impingement designs are based on the principle of air motivation, with a blower being the usual means of moving the air.

An attempt has been made to utilize air impingement cooling for providing a heat transfer mechanism for an electronic circuit module assembly. Such an arrangement is disclosed in U.S. Pat. No. 4,277,816 issued to Dunn et al on July 7, 1981, entitled "Electronic Circuit Module Cooling." Dunn et al utilizes air directed under positive pressure to remove heat from electronic circuit modules mounted on a circuit board assembly. An air plenum chamber is mounted adjacent the circuit board assembly, with a plurality of openings therein, one for each electronic circuit module of the assembly. Air passes into the air plenum and is directed through the openings into heat sinks of each electronic module, causing air turbulence within the heat sinks. The spent air, after escaping from within the heat sinks, is exhausted through channels defined between the electronic modules in a manner such that the spent air has minimal impingement on adjacent modules. Although the air plenum can be designed to be relatively air tight, after the air is directed therefrom onto the module to be cooled, there is no requirement to maintain air tightness within the system.

However, the spent air, after having been warmed by removing heat from a heat sink, may degrade the ability of the impinging cooling air to remove heat from another or adjacent heat sink. Although such cross flow degradation can be remedied by increasing the volume of impinging air supplied, the efficiency of the cooling arrangement may be degraded, since more energy is required to propel the larger air volume.

An alternate attempt has been made to utilize air impingement cooling for providing an air cooling arrangement for a column of integrated circuit modules in a computer frame. Such an arrangement is disclosed in U.S. Pat. No. 4,233,644 issued to Hwang et al on Nov. 11, 1980, entitled "Dual-Pull Air Cooling for a Computer Frame." Hwang et al utilizes a pair of air moving devices to pull air through the column. Air flow guides extend from a cover plate having openings therein to allow air to pass into heat sinks attached to the modules and confine the air flow to a vertical impinging pattern. Air distribution ducts are arranged on opposite sides of the heat sinks facilitating exhausting of spent air.

In many instances, however, the air cooling arrangement as described above may required major cabinet level redesign of existing computer frames and possibly, component level changes.

Therefore, in accordance with an aspect of the present invention, a feature is to provide a new and improved method and apparatus for controlled air impingement module cooling of electronic components mounted to a circuit board.

In accordance with another aspect of the present invention, a feature is to provide an efficient method and apparatus of air impingement exhaust which prevents degradation of the impingement system upon other components mounted to the circuit board.

A further feature of the present invention is to provide a method and apparatus for controlled air impingement module cooling that eliminates the need for major computer cabinet redesign.

SUMMARY OF THE INVENTION

The foregoing and other features of the invention are accomplished by providing a modularized air-impingement cooling apparatus for high power dissipating integrated circuit components mounted to a circuit board, the circuit board being configured for insertion into a computer backplane capable of receiving a plurality of adjacent circuit boards. In general, a pin-fin designed heat sink is attached to the electronic component requiring heat removal. A cooling plenum arrangement is configured for attachment to the printed circuit board, with the arrangement including a pair of partitions or baffles, configured, dimensioned and arranged for attachment, one in spaced relation to the other and to the circuit board for defining first and second plenums which are, respectively an inlet and exhaust plenum. The exhaust plenum is in proximity to the circuit board and components mounted thereon, and is defined, in part, by a first plate-shaped partition or baffle member in spaced relation to the printed circuit board with openings in the baffle, the openings generally corresponding to the locations of the heat dissipating components.

Projecting from the edges of the openings are a plurality of walls or side members defining a fence or pocket substantially surrounding the integrated circuit/heat sink module, the walls extending from the first baffle member into engagement with, or into proximate relation to, the circuit board. The walls along with the circuit board, are configured, dimensioned and arranged to define a pocket, with walls generally equally spaced around the perimeter of the integrated circuit/heat sink module, which walls, in effect, separate and isolate the thermal effects of one module relative to another. A second inlet plenum is defined, in part, by a second partition or baffle member in spaced relation to the first baffle member, the second baffle member also serving in part to define the inlet plenum. The second baffle member is provided with a pattern of multi-jet nozzle arrays and apertures for alignment or indexing with the heat sinks and electronic components, with the front portion of the nozzle arrays in spaced proximate relation to the ends of the rods of the heat sink. The inlet plenum is defined, in part, by the surface of an adjacent circuit board, in an adjacent slot. An air-moving device is utilized to draw air into the inlet plenum, which then directs the air stream into the nozzles. The air stream impinges upon the heat sinks, and is then suctioned out through the exhaust plenum, thereby removing heat from the electronic components.

In accordance with the invention, the modularized air-impingement cooling apparatus maximizes heat removal efficiency in operation and system design, while minimizing inter-component temperature variation. Additionally, the cooling apparatus of the invention minimizes air stream volume requirements and air generated noise, while providing EMI shielding for the electronic components.

Other objects, features and advantages of the invention will become apparent from a reading of the specification when taken in conjunction with the drawings, in which like reference numerals refer to like elements in the several views.

DESCRIPTION OF THE PREFERRED EMBODIMENTS

Figure 1:
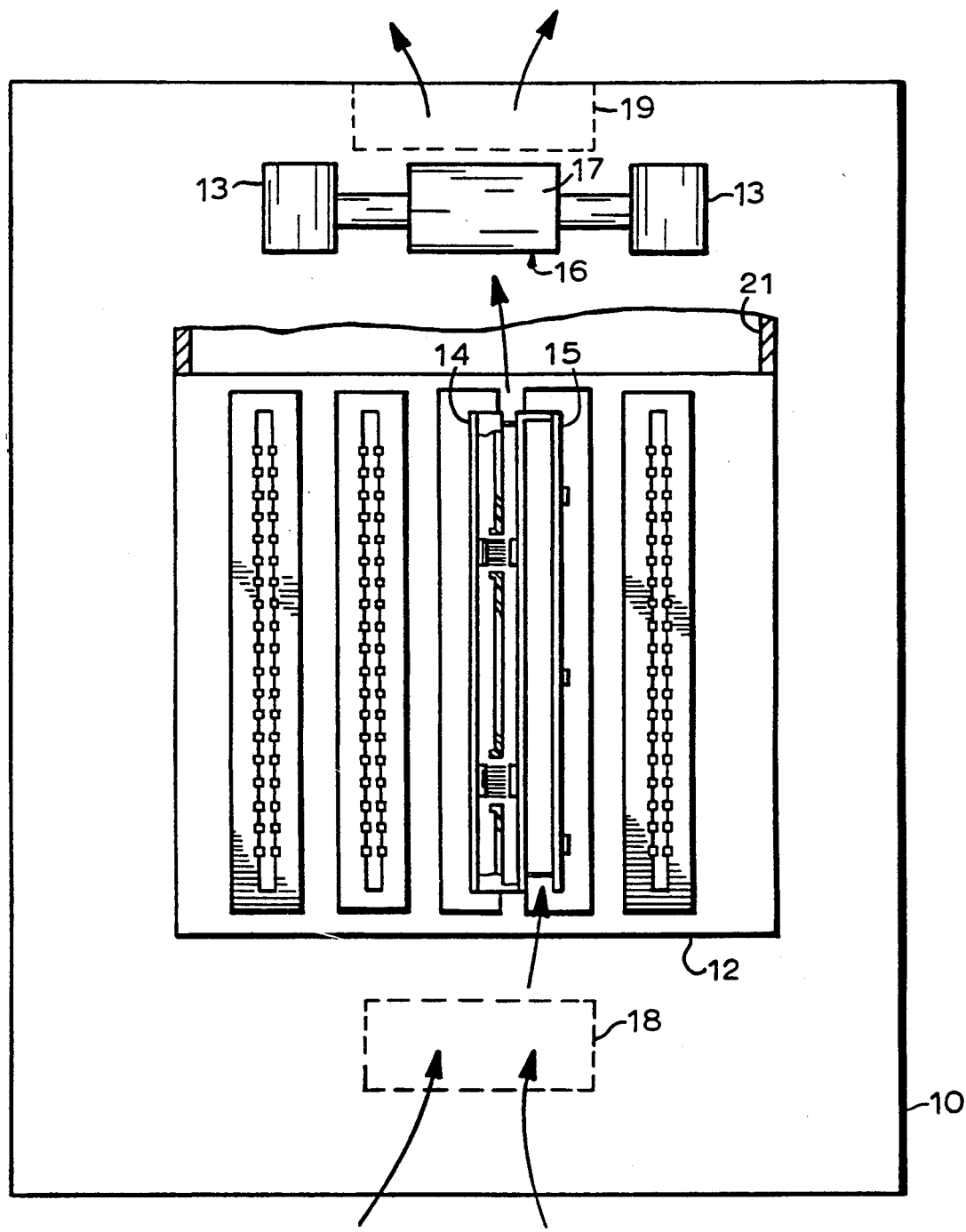
FIG. 1 is a front diagrammatic view of a computer enclosure housing an air-impingement cooling apparatus according to the invention.

Referring now to the drawings, and particularly to FIG. 1, there is shown a front plan view of the interior of a computer backplane 12, which is of the typically installed in an air-cooled computer enclosure or cabinet 10, and having parts of which are eliminated for clarity. The backplane 12 is a conventional backplane which includes a plurality of adjacent edge connector members, which, in part, define slots (not shown), each of which is configured for receiving a circuit board, two adjacent circuit boards of which have been designated by reference numerals 14, 15. Circuit board 14 (15), is, for example, a printed circuit board, of the conventional type, that is, a generally rectangular, generally planar, plate-shaped member having an electrical edge connector portion on one edge thereof (not shown) for insertion into one connector or slot of the backplane 12. Circuit board 14 is of a conventional configuration and consists of an insulative substrate having conductive lamina on the two major, opposite surfaces thereof, with selected portions of the conductive lamina removed to define conductive paths between the various components assembled thereon. Board 14 may also have numerous internal conductive and non-conductive layers sandwiched between the outer, opposite surfaces.

Also located within the enclosure or computer cabinet 10 is an air moving device, such as a blower 16, and a plurality of screen air filters 18, 19. The blower 16 is of conventional design consisting of a blower motor 17 flanked on both sides by blower fans 13. Intermediate the backplane 12 and the blower 16, with the enclosure 10, there is a distribution duct 21, which is positioned directly above the area allocated for the circuit boards 14, 15. Blower 16 is configured for moving or drawing air so as to create a negative pressure environment within the cabinet 10, that is, air is drawn or suctioned into the cabinet 10 through screen filter 18 located at the bottom of the cabinet 10, through the air impingement cooling apparatus to be described, through the distribution duct 21, and, thereafter, exhaust out through screen filter 19 located at the top of the cabinet 10. This distribution duct 21 serves the purpose of providing a uniform suction during operation as will be described. The pulling of cooling air into computer cabinets has formed the basis for conventional mass air flow cooling designs in prior computer cabinets. However, as will be hereinafter described, the present invention utilizes negative pressure or suction in an air-impingement cooling apparatus, which is capable of being implemented at the individual circuit board level or, in other words, is ideally suited for module-level modification or "retrofit", and thus, does not require major redesign of existing computer cabinets.

Figure 2:
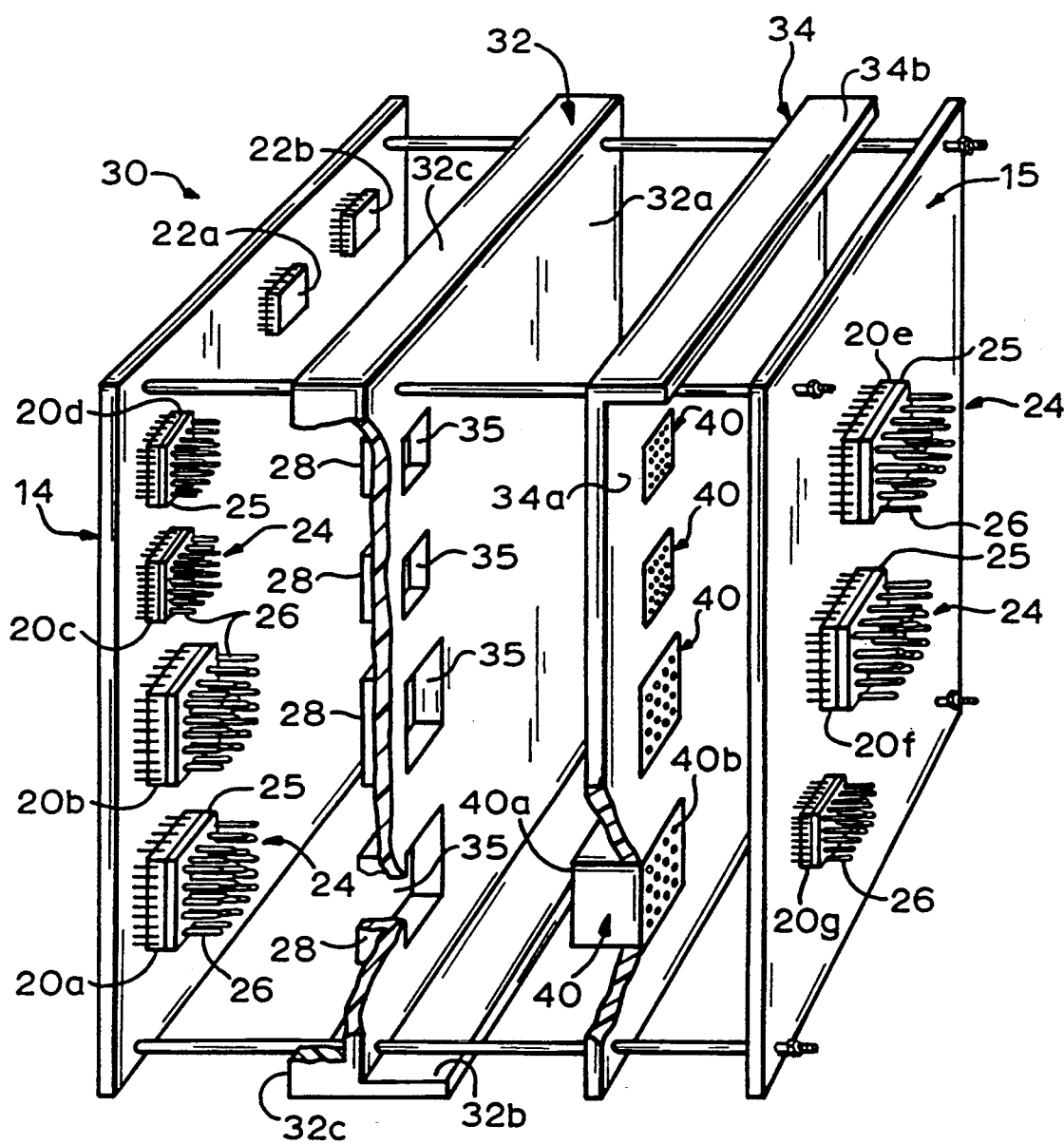
FIG. 2 is an exploded perspective view of the air impingement cooling apparatus used in the enclosure of FIG. 1.

Referring also to FIG. 2, there are depicted first and second circuit boards 14 and 15, each of which is configured for insertion into first and second adjacent slots of the backplane 12. The circuit boards 14 and 15 each have integrated circuit components 20a–20g mounted on a first surface thereof, components 20a–20d being located on circuit board 14. Other components 22a, 22b are mounted on the surface of circuit board 14, but for purposes of clarity, only a few components are shown. The circuit components 22a, 22b are low power dissipation devices with which the instant invention is not concerned. The primary thrust of the instant invention is to provide air impingement cooling for those components on a printed circuit board which have what may be considered high power dissipation. These integrated circuits, designated 20a–20g, each include a heat sink 24 intimately bonded in intimate heat transfer relation to a surface of the integrated circuit component to form an integrated circuit module.

The integrated circuit components 20a–20g mounted on circuit board 14,14 may be VLSI CMOS or ECL integrated circuit components capable of dissipating large amounts of heat energy. Of course, other technologically similar electronic components and devices may utilize the advantages of the invention. Nevertheless, for the present technology, such components are in the context of high power dissipation components, and, as such, may, for example, dissipate heat energy in the realm of fifteen to one hundred watts.

Heat sink 24 is of a pin-fin design, and as such, has a plurality of heat-dissipating, rod-like or pin-like fins 26 vertically emanating from the body 25 of heat sink 24, the pin-fin design being capable of increasing the surface area and heat dissipation of the heat sink 24. As will be apparent to those skilled in the art, the pin-fin design of heat sink 24 is optional and not essential to the basic teaching of the present invention, which relates to heat removal in general. Heat sink 24 will typically be larger in volume than the component 20 (a generic reference to any of the components 20a-20g) on which it is mounted, although the mating or attaching surfaces will be generally identical, that is, the surface area of the component 20 will generally correspond to the surface area of the heat sink surface to which it is attached.

In accordance with the principles of the present invention, in order to remove heat energy from such high power dissipation components, a first embodiment of the modularized air-impingement cooling apparatus is provided, such apparatus including a cooling plenum assembly or arrangement, generally designated 30. Assembly 30 is fabricated or constructed in an overall configuration, in plan view, to correspond to the dimensions of the printed circuit board 14. In side elevation, the overall height or width of the plenum assembly 30 corresponds generally to the spacing between adjacent circuit boards 14 and 15 when inserted within the corresponding adjacent slots of the backplane 12. As will become apparent, the plenum assembly 30 is intended to utilize, as part thereof, the surface of the adjacent circuit board 15 to define a portion of a plenum. This surface or side of the circuit board 15 used to define a part of the plenum is the side opposite that to which components 20e-20g are mounted.

The plenum assembly 30 is formed from first and second baffle members or partitions, each of which includes a generally planar, generally plate-shaped main body portion which is generally parallel to the other. By reference to FIG. 2, the partitions or baffle members, generally designated 32 and 34, each include a generally rectangular, generally planar portion 32a, 32a, each of which is generally identically configured in area and dimension to the area and dimension of the circuit board 14 (and likewise board 15). For purpose of discussion, member 32 will be referred to as the exhaust baffle member and member 34 will be referred to as the inlet baffle member. The exhaust baffle member 32 is configured, dimensioned and arranged for attachment to circuit board 14, and the inlet baffle member 34 is configured, dimensioned, and arranged for abutting relation with adjacent circuit board 15 and spaced relation to baffle member 32. The exhaust baffle member 32 may be formed of any suitable material, such as plastic material and, if desired, may be formed of metal to provide an EMI shielding of the components on board 14.

For providing appropriate inlet and outlet openings, exhaust baffle member 32, at the lower end thereof as viewed in FIG. 2, is provided with a transversely extending edge portion 32b, which extends the width of the member 32. As will become apparent, this edge portion 32b provides an end wall of the air cooling assembly 30. Similarly, inlet baffle member 34 is provided at the upper edge thereof (as viewed in the drawing) with a transversely extending edge portion 34b, which extends the width of the member 34. This edge portion 34b is intended for edge abutting relation with the adjacent circuit board 15. Each of the edge portions 32b, 32b may be separately formed and attached or may be integrally formed with the respective member 32, 34.

Exhaust baffle member 32, as illustrated, is configured as a box-like cover with a peripheral edge 32c configured for edge abutting relation with the perimeter of circuit board 14. The peripheral edge 32c extends in a direction opposite that of edge portion 32b. The main body portion 32a includes a plurality of openings, generally designated 35, located in a pattern corresponding or indexed to the pattern or placement of the components 20a-20d of circuit board 14. Each opening 35 is configured, in dimension and area, to a dimension greater than the areal dimension of the component 20a-20g. Each opening 35 is likewise provided with a peripheral wall 28 in projecting relation thereto, that is, the walls 28 define a walled opening which, with baffle member 32 secured or attached to board 14, will provide a peripheral wall about the respective components 20a-20d associated therewith, with the spacing between the walls 28 and the adjacent sides of the component being generally equal about the periphery. The extent of the projection of the walls 28 form the surface 32a of the baffle member 32 corresponds generally to the transverse dimension of the peripheral edge 32c, to the extent that, as attached, the distal ends of the walls 28 will terminate at or near the surface of the circuit board 14 with the peripheral edge 32c in abutting relation with the surface of circuit board 14.

The main body portion 34a of the inlet baffle member 34 is provided with a like plurality of air impingement control means in the form of a pattern of multi-jet nozzle arrays 40, each of which is positioned for indexing and alignment with an opening 35 in the like pattern of openings and one of the corresponding components 20a-20d, with its attached heat sinks 24, with the components 20 being positioned in a like pattern. Nozzle array 40 may be inserted into apertures within the baffle portion 34a by any suitable means, for example press-fitting into an opening in inlet baffle 34, or may be formed integrally with the inlet baffle member 34, such as by molding. The front portion 40a of the nozzle array 40 protrudes from the main body portion 34a of inlet baffle member 34 in a direction facing heat sink 24 and in a predetermined proximity thereto, while the back portion 40b of nozzle array 40 is approximately level with the planar surface of inlet baffle member 34.

Figure 3:
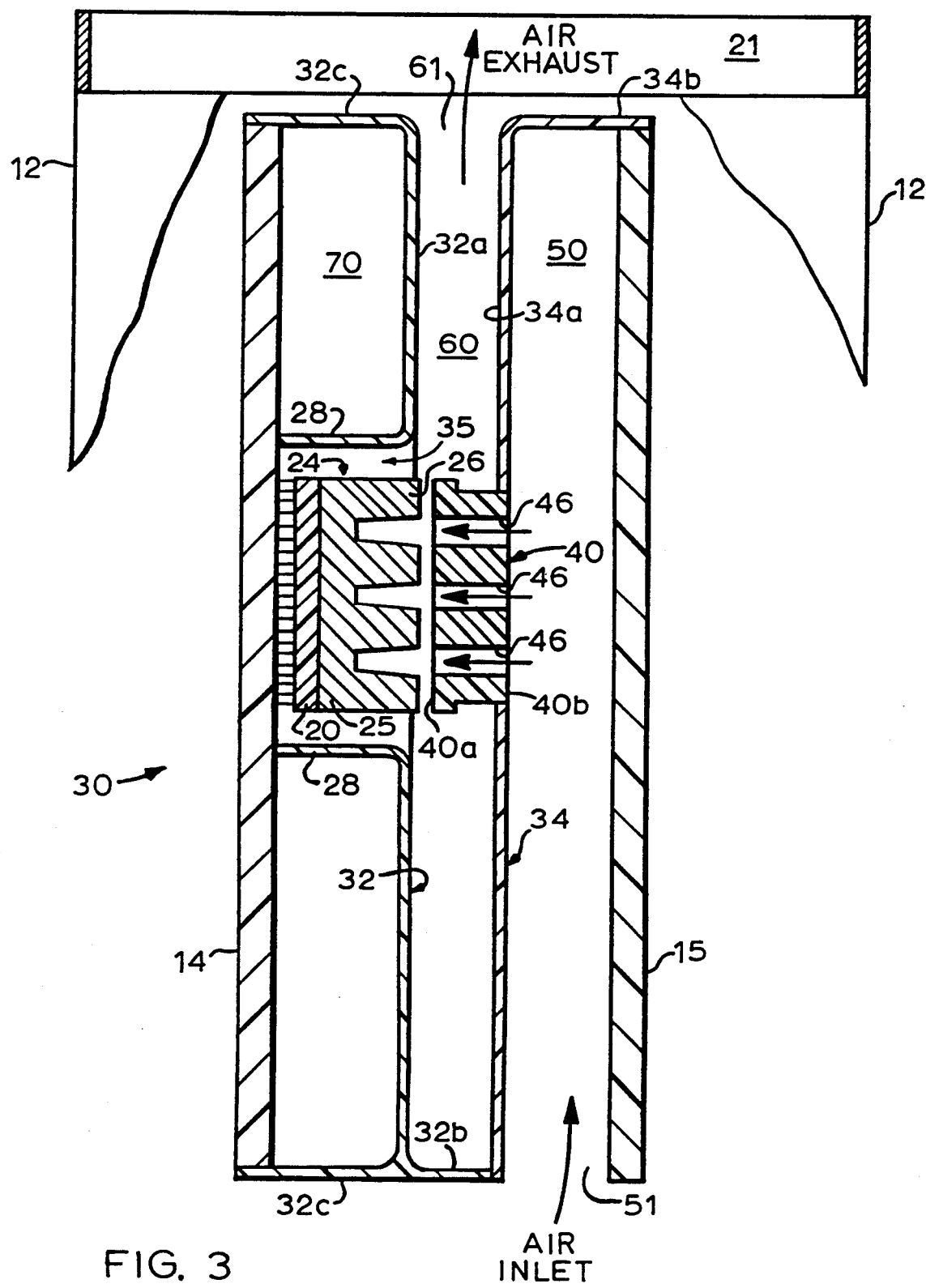
FIG. 3 is a diagrammatic cross-sectional view of the air impingement cooling apparatus.

Referring now to FIG. 3, there is depicted a diagrammatic representation of the cooling assembly 30, attached between two generally parallel circuit boards 14 and 15. As will become apparent, the spacing between the two circuit boards 14 and 15 corresponds to the normal spacing between circuit boards in backplane 12 as inserted into the backplane 12. The orientation of the parts in FIG. 3 corresponds to the orientation of the parts in the enclosure 10 of FIG. 1, that is, the blower 16 will create a negative pressure adjacent to the top of the cooling apparatus 30, and air will be drawn in through the bottom.

The elements in FIG. 3 are somewhat exaggerated and are not to scale for the purpose of ease of depiction and ease of description. Specifically, no attempt has been made to depict the number of individual jet nozzles or the scale size of the nozzle array 40 and the circuit module consisting of component 20 and heat sink 24, although the drawings depict the relationship and sizes relative to one another. In FIG. 3, for simplicity, only one circuit module and one nozzle array 40 are shown.

Fundamentally, the plenum arrangement 30 includes an air inlet plenum, generally designated 50, in side by side and parallel relation with an air exhaust plenum, generally designated 60. The exhaust baffle member 32 is configured to define pockets which include openings 35 and the peripheral walls 28 about the openings 35. The walls 28 effectively provide thermal isolation between adjacent heat dissipating components 20 to preclude the cross flow degradation caused by the spent air, after having been warmed by removing heat from a heat sink, then being utilized to cool another adjacent device. Although FIG. 3 depicts the distal edge of the wall 28 in abutting relation with the circuit board 14, as will be discussed in conjunction with an alternate embodiment, the edges of wall 28 may be in spaced relation to the board 14, within certain limits, without losing the effectiveness of the wall 28 and pocket formed thereby, to act as a thermal isolation device. Intermediate the main body portion 32a of the baffle member 32 and the board 14, there is another space, generally designated 70, which space acts as a dead space or insulation space in the thermal system for the cooling arrangement.

As shown in FIG. 3, the center axis of the opening 35 of baffle member 32 is aligned with the center axis of the component 20 and heat sink 24. Likewise, the center axis of the nozzle array 40 is on the same line. The exit end 40a of the nozzle array 40 is generally planar and is positioned in facing proximate relation to a plane defined by the terminal ends of the pin like or rod like projections 26 of the heat sink 24. As depicted, this plane of the ends of the rod like projections 26 of the heat sink 24 is generally coplanar with the plane of the main body portion 32, although it need not be. The terminal end or exit end 40a of the nozzle array 40 is positioned in proximate relation to the plane of the distal ends of the pin or rod-like projections 26 of the heat sink 24, this distance corresponding to about one diameter or less of the individual jet nozzle of the array 40. With the plenum arrangement 30 thus configured, the heat sink 24 may project into the plenum 60 or may terminate within the pocket, provided other criteria are met, notably the thermal isolation provided by the walls 28 and the proximate relation of the exit end 40a of the nozzle array 40 to the adjacent ends of the heat sink 24. In any event, the exact geometric details will be determined by the design requirements.

Briefly, in operation, the entering air into the plenum assembly 30 will be drawn in through air inlet opening 51 into air inlet plenum 50, in an upwards or generally vertical direction as viewed in the drawings, although it is to be understood that the air flow direction is independent of gravity or buoyancy direction. This air will then be drawn through the individual jet nozzles 46, in a direction transverse to the original direction. The air will then impinge on the upper edges of the rod-like projections 26 of the heat sink 24, with the heat drawn from both the heat sink 24 and the heat within the pocket then passing out through the exhaust plenum 60, via distribution duct 21, and thence out through the upper screened opening 19 (See FIG. 1).

By reference also to FIG. 1 and 2, it is to be noted that the baffle member 32 acts to cover the board 14 with the main body portion 32a in spaced relation thereto. In other words, the side edges 32c of the dead space 70 are substantially sealed, As shown, neither of the plenums 50 or 60 have the side edges thereof sealed, although they may be. In practice, with suction or negative pressure at the upper part, that is within distribution duct 21, it has been found that sealing of the side edges is not mandatory to achieve the desired air flow through the inlet plenum 50, through the nozzle array 40 and through the exhaust plenum 60.

Figure 4:
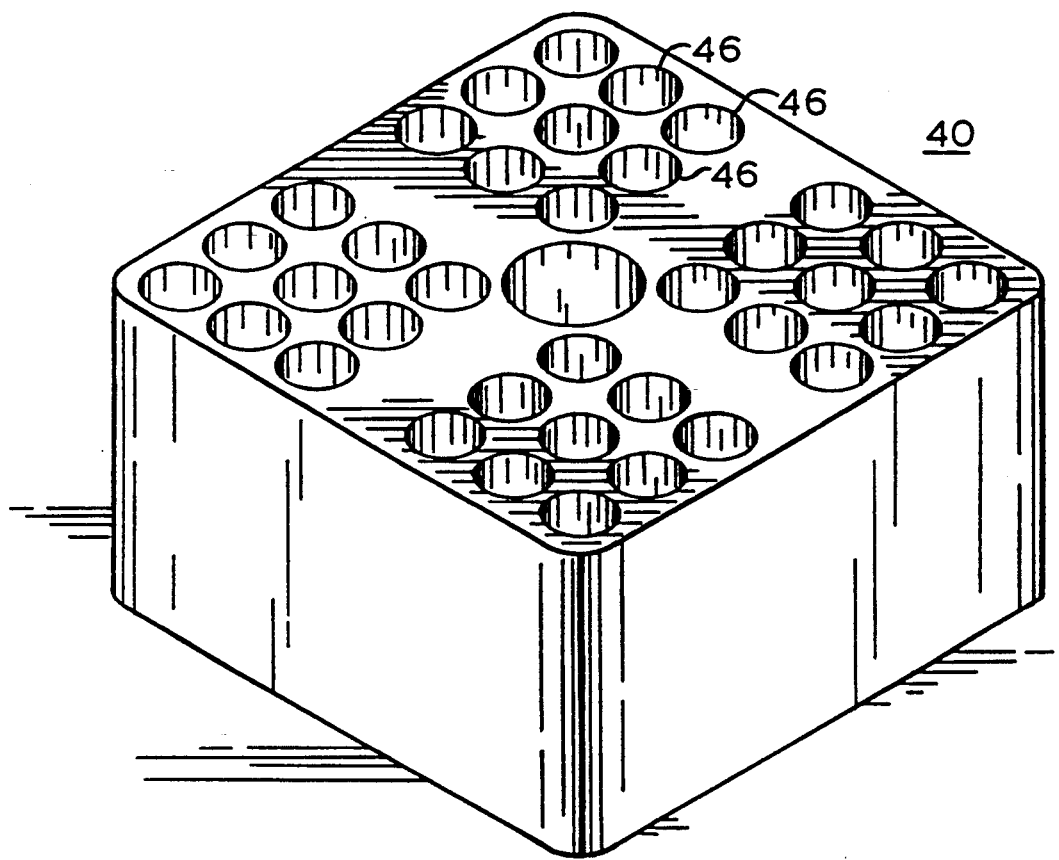
FIG. 4 is a perspective view of a multi-jet nozzle array utilized in the apparatus of FIGS. 1 and 3.

FIG. 4 illustrates the multi-jet nozzle array 40, which is preferably made of a plastic-type material capable of flexible, press-fit insertion into the opening of inlet baffle 34 corresponding to the dimensions of nozzle array 40. Alternatively, nozzle array 40 may be integrally formed with baffle member 34, such as by molding, or may be made of metal (or metal-plated plastic), if EMI shielding of components is desired. Preferably, each individual nozzle 46 of the nozzle array 40 has a generally rounded and smooth front with a generally rounded and countersunk back (not shown), and is appropriately designed similar in cross-sectional shape to the heat sink 24. A side of the array 40 has a length in the range of 1.25 to 2.0 times the depth of the array 40. As with other design criteria embodied herein, the exact factor will be determined by cooling requirements. The multi-jet nozzle array 40 is configured as a plurality of individual jet nozzles 46, preferably thirty-seven, of a predetermined length and diameter, that is, the ratio of length of the individual nozzle to the diameter of the nozzle is greater than one. The nozzles 46 are generally cylindrical or conical, and are generally radially symmetrical, however it is to be understood that the present invention is equally applicable to nozzle arrays having a different number of jet nozzles, for example at least one, with different sizes and shapes.

Operationally, and referring again to FIG. 3, cooling air is drawn into inlet opening 51 and into inlet plenum 50 by the blower 16 and is channeled to the nozzle array 40, where it is then forced in a direction transverse to the air flow in plenums 50 and 60 upon heat sink 24 of component 20. The cooling air is directed to the body 25 of the heat sink 24 so that it will perpendicularly impinge at the base of the pin-like projections 26 of the heat sink 24 and then circulate turbulently among the pins 26, thereby enhancing the thermal transfer interchange of heat energy to the cooling (not spent) air. Thereafter, the spent air is further drawn outwardly and upwardly from heat sink 24 and the space with the pocket defined by walls 28 surrounding component 20 into the exhaust plenum 60, such that the spent air is isolated and prevented from impinging upon adjacent components. The spent air is then eventually removed via outlet 61 into distribution duct 21 and out from the computer cabinet 10 by blower 16. In accordance with a feature of the present invention, the extracting of spent air from the heat sink 24 to the exhaust plenum 60, which is remote from other heat-producing and radiating components, optimizes thermal transfer efficiency since the configuration of the exhaust plenum 60 and pocket within which the component 20 is positioned allows control over the cooling process thus eliminating cross-flow degradation and minimizing the volume of air and blower energy required to cool component 20.

The size of the opening 35 of exhaust baffle 32, the size and configuration of nozzle array 40, and the flow of the air stream within the cabinet 10 are all variables which may be adjusted according to the requirements of the particular cooling process. In particular, certain relationships between variables may be critical to achieving optimum heat removal and minimum inter-component temperature variation, such as the relationship between the area of the nozzle array 40 to the area of the heat sink 24; the distance between the nozzle array 40 and the heat sink 24; the number of individual nozzles 46 in an array 40 and the gradient of those nozzles 46; and the size and volumetric capacity of the air movement device or blower 16.

In a presently preferred embodiment of the invention, the distance between heat sink 24 and nozzle array 40 is preferably equal to about one diameter of an individual nozzle 46. The cross-sectional area of the nozzle array 40 should not exceed the adjacent cross-sectional area of a respective heat sink 24. Additionally, the gradient of the diameters of nozzles 46 of array 40 are such that the nozzles 46 located at the center of array 40 have larger diameters than the nozzles 46 located at the outer periphery of the array 40, while the majority of the nozzles have the same diameter.

The nozzle arrays 40 and air inlet plenum 50 supply cooling air to the components 20 requiring heat removal, and the air exhaust plenum 60 removes the resulting spent air without thermal cross flow and subsequent cooling degradation to other components mounted on circuit board 14. The designed relationship between the heat sink 24 and nozzle array 40 controls the air flow distribution and maximizes heat transfer, while the baffle member 32, if made of metallic material, can provide EMI shielding at the printed circuit board level. Additionally, the inlet baffle 34 and exhaust baffle 32, together with respective plenums 50,60, provide air flow uniformity throughout the flow path, thus reducing pressure drop and power requirements, while reducing acoustic noise.

The use of negative pressure air motivation provides at least two advantages to positive pressure cooling methods. First, suction air motivation allows a high degree of control over the air flow path, thus providing optimum utilization of available air volume and reducing the amount of air needed. A second advantage of suction air flow is that it has the natural property of producing less noise in operation than a similar flow of positive pressure air. This reduction in air noise is further facilitated by the shape and design of the plenum assembly 30.

Figure 5:
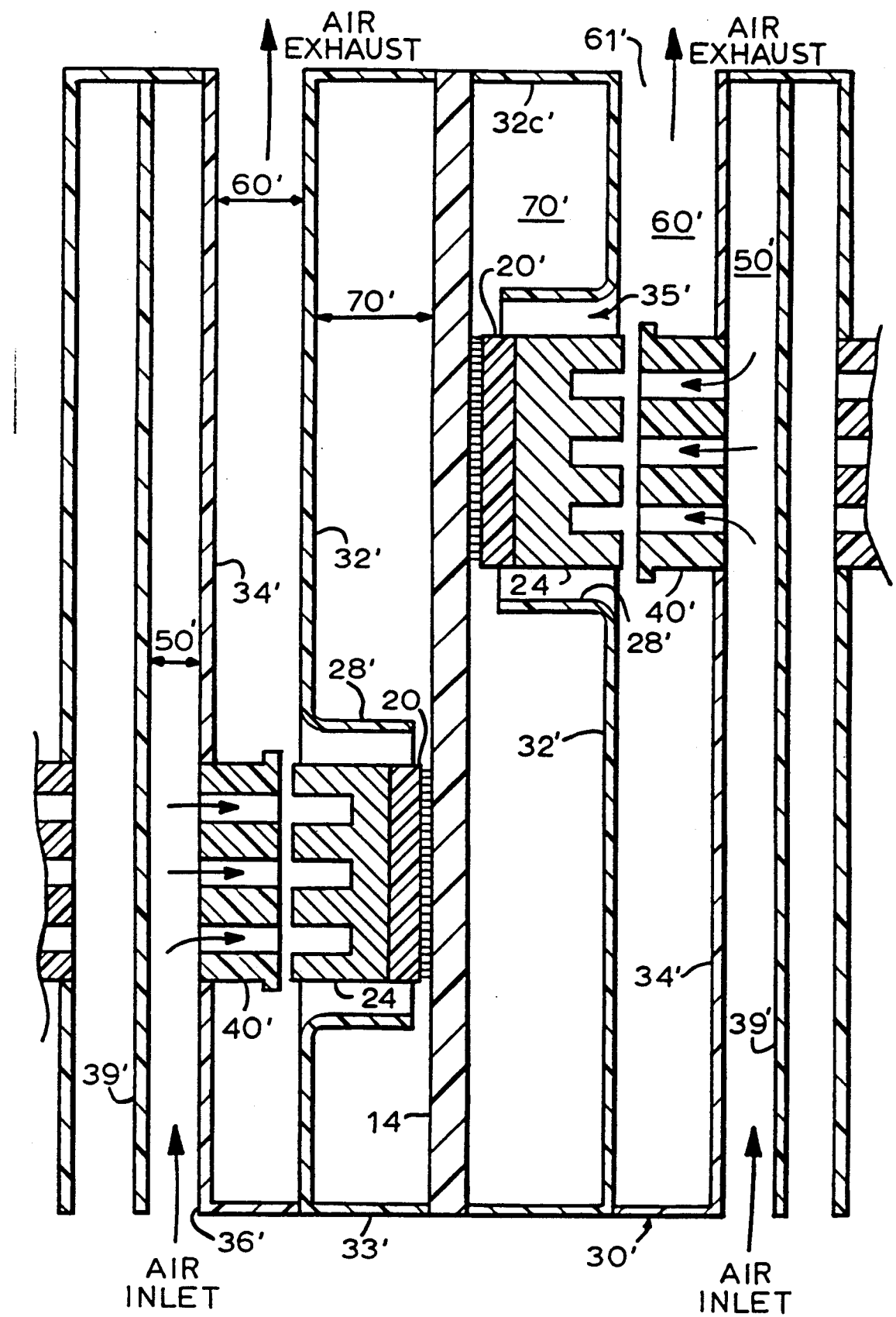
FIG. 5 is a diagrammatic view of an alternate embodiment of the air-impingement cooling apparatus according to the invention.

FIG. 5 depicts a second embodiment of the air-impingement cooling apparatus according to the invention, the operation of which is identical to the embodiment of the invention set forth in FIGS. 2 and 3. Circuit board 14 has components 20 mounted on both surfaces thereof by means of conventional surface mounting techniques and, as such, plenum assembly 30' is attached to both surfaces. Individual parts of plenum assembly 30' may be constructed as previously described, that is of molded plastic, constructed plastic or formed metal. In this embodiment, three portions or components are interconnected, that is, an exhaust baffle 32', an inlet baffle 34' and a module baffle 39'.

Exhaust baffle 32' of assembly 30' is configured as a plate-shaped, four-sided member similar in size and shape to the exhaust baffle 32 of the first embodiment and is dimensioned and arranged for attachment to circuit board 14, with walls 28' defining pockets which receive the component 20 and heat sink 24. As previously discussed, the walls 28' need not extend into abutting relation with the circuit board 14 to provide the thermal isolation of the component 20. In actual practice, it has been found that the walls 28' preferably extend into proximate relation with the board 14 a distance from the board 14 no greater than the plane of the interface of the surface of the component 20 with the heat sink 24, that is, the walls 28' should not be above this interface.

Exhaust baffle 32' includes at least one aperture or opening 35' positioned and dimensioned for alignment over the heat sink 24, again in a manner similar to the embodiment of FIGS. 2 and 3. The exhaust baffle 32' is imperforately affixed at all four sides to circuit board 14 by perpendicular walls 32c', creating an insulating air space 70'. The perpendicular walls 32c' are made of any suitable material, and are sealed to circuit board 14 and exhaust baffle 32' by any suitable means, such as a sealing gasket and screws. Alternatively, as previously discussed, the walls 32c' may be formed integrally with the baffle member 32'.

The inlet baffle 34' of assembly 30' is configured as a plate-shaped, four-sided member similar in size and shape to inlet baffle 34 and includes at least one multi-jet nozzle array 40'. Nozzle array 40' is likewise similar to nozzle array 40 of FIG. 4, and is thus configured for alignment with component 20 and heat sink 24. The inlet baffle 34' is dimensioned and arranged to correspond to the area of exhaust baffle 32', in spaced relation, thereby defining exhaust plenum 60'. The upper edges of exhaust baffle 34' are open at 61', the side facing the top of cabinet 10 and backplane 12, and defines the exit for spent air leaving exhaust plenum 60'.

The module baffle 39' is configured as an elongate, generally planar, plate-shaped member which is dimensioned to conform to the area of inlet baffle 34', thereby defining an inlet plenum 50'. Side 36' of inlet baffle 34', the side facing the bottom of cabinet 10 and backplane 12, is open and defines the entrance for cooling air to inlet plenum 50'. It can be seen in this embodiment that circuit boards with heat dissipating components 20 mounted on both sides thereof may be readily provided with cooling arrangements with slight variations of the embodiment of FIGS. 2 and 3.

Figure 6:
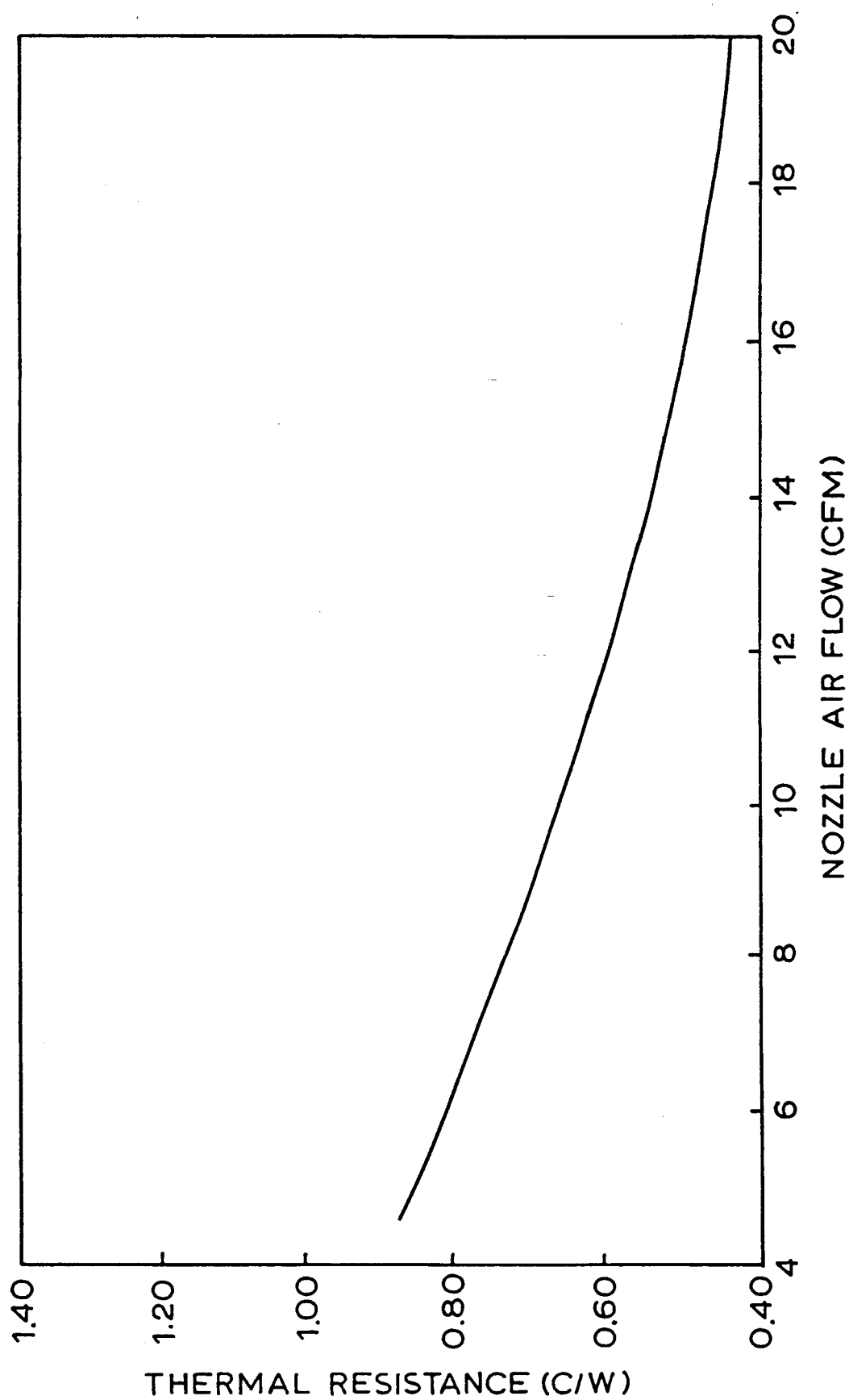
FIG. 6 is a graphical representation of the relationship of heat removal efficiency to air flow volume.

Referring now to FIG. 6, a graphical representation of the performance results of a typical nozzle array 40 is shown with the axes labeled "Thermal Resistance" v. "Nozzle Air Flow." Thermal resistance is presented in units of degrees difference required per watt of energy extracted, while air flow is in units of cubic feet per minute. The graph shows a reduction in thermal resistance as the air flow increases. Traditional cooling systems have been rated at a thermal resistance factor of approximately 9.00, compared to a factor of less than 1.00 for the present invention.

While there have been shown and described preferred embodiments of the present invention, it is to be understood that other adaptations may be made within the spirit and scope of the invention. One feature of the invention lies in the readily providing cooling while obviating the need for major cabinet level redesign of existing computer cabinets and, as such, individual circuit boards containing a variety of components capable of high power dissipation levels may be modified to exploit the benefits of the invention and subsequently inserted back into the existing cabinet. Also, it is to be understood that although the preceding description has proceeded with reference to the cooling of components mounted on a circuit board in a computer cabinet, the invention is equally applicable to other electronics environments where heat removal and temperature equality among components designed to operate in a specified temperature range is significant. In addition, while the inlet plenum 50 in the first embodiment utilizes the adjacent circuit board 15 as part thereof, the plenum assembly 30 may also be constructed with a separate partition in lieu of the circuit board 15.

It will therefore be apparent to those skilled in the art that various changes and modifications in the specifically described embodiments can be carried out without departing from the scope of the invention which is to be limited only by the scope of the appended claims.

What is claimed is:

1. Cooling apparatus for removing the heat from heat dissipating electronic components mounted to a first circuit board configured for insertion into a backplane, said apparatus comprising:

wall means for substantially thermally isolating each of said electronic components one from the other;

inlet means for directing cooling air to said electronic components, said inlet means having nozzle means configured, dimensioned and arranged for alignment with each of said electronic components;

exhaust means for isolating and removing heated air from said electronic components, said exhaust means arranged between said inlet means and said first circuit board; and air-moving means for drawing cooling air into said inlet means and removing heated air from said exhaust means.

2. Cooling apparatus as recited in claim 1 further comprising heat sink means attached to said electronic components.

3. Cooling apparatus as recited in claim 2 wherein said backplane includes a second circuit board adjacent to said first circuit board, and wherein said inlet means includes an inlet baffle affixed to said adjacent second circuit board, thereby creating an inlet plenum for receiving cooling air.

4. Cooling apparatus as recited in claim 3 wherein said nozzle means includes a nozzle array having at least one nozzle for directing cooling air onto said heat sink means.

5. Cooling apparatus as recited in claim 4 wherein said exhaust means includes an exhaust baffle affixed to said first circuit board, said exhaust baffle having aperture means configured, dimensioned and arranged for alignment with said heat sink means, and wherein said wall means are secured to said exhaust baffle about the periphery of said aperture means.

6. Cooling apparatus as recited in claim 5 wherein said exhaust baffle is formed of metal material to provide EMI shielding of said components.

7. Cooling apparatus as recited in claim 6 wherein said inlet baffle is attached relative to said exhaust baffle to form an exhaust plenum for removing heating air.

8. Cooling apparatus as recited in claim 7 wherein said air-moving means is a blower configured for suctioning air.

9. Cooling apparatus as recited in claim 1 wherein said air-moving means is a blower configured for suctioning air.

10. Method for removing heat from heat dissipating electronic components mounted to a circuit board comprising:

forming an inlet air plenum;

forming an exhaust air plenum;

forming pocket means about said electronic components for generally thermally isolating each electronic component relative to another;

suctioning cooling air into said inlet air plenum;

directing cooling air onto said electronic components; and removing heated air from said electronic components via said pocket means and said exhaust air plenum.

11. The method of claim 10 wherein said inlet air plenum includes nozzle means configured, dimensioned and arranged for alignment with said electronic components.

12. The method of claim 11 wherein said exhaust air plenum includes aperture means configured, dimensioned and arranged for alignment with said electronic components.

13. The method of claim 12 wherein said pocket means includes said apertures means.

14. Cooling apparatus for removing heat from at least two heat dissipating electronic components mounted to a first circuit board having a plurality of other components mounted thereon, said first circuit board configured for insertion into a backplane of a computer cabinet, said cabinet including an air moving device for drawing cooling air into said cabinet and removing spent air from said cabinet, said backplane configured for receiving a second circuit board adjacent to said first circuit board, said apparatus comprising:

heat sink means attached to said heat dissipating electronic components;

inlet means for directing cooling air to said heat sink means, said inlet means including, as part thereof, said second circuit board for creating an inlet plenum for receiving cooling air; and exhaust means including pocket means having wall means substantially about the periphery of said heat dissipating electronic components for thermally isolating one such component from another and for precluding spent air cooling one such component from flowing to another such component, said exhaust means being affixed to said first circuit board and in air flow communication with said inlet means and having an exhaust outlet for removing spent air.

15. Cooling apparatus as recited in claim 14 wherein said inlet means includes an inlet baffle having nozzle mean configured, dimensioned and arranged for alignment with said heat sink means, said nozzle means being positioned, relative to said heat dissipating components for directing air onto said heat sink means.

16. Cooling apparatus as recited in claim 15 wherein said nozzle means includes a multi-jet nozzle array having a plurality of nozzles, the majority of which are a given diameter, and wherein said nozzles have a predetermined length to a diameter ratio with said array being aligned at a predetermined distance from said heat sink means.

17. Cooling apparatus as recited in claim 16 wherein said predetermined distance between said heat sink means and said nozzle array is less than said given diameter.

18. Cooling apparatus as recited in claim 17 wherein said exhaust means includes an exhaust baffle having aperture means configured, dimensioned and arranged for alignment with said heat sink means, and said wall means are about the periphery of said aperture means.

19. Cooling apparatus as recited in claim 18 wherein said exhaust baffle is formed of metal material to provide EMI shielding of said components.

20. Cooling apparatus as recited in claim 19 wherein said heat sink means is a heat sink.

21. Cooling apparatus as recited in claim 20 wherein said heat sink has a body and a plurality of pin-like fins emanating from said body.

22. Cooling apparatus as recited in claim 21 wherein said predetermined position is such that said inner edges of said aperture terminate at approximately the height where said fins emanate from said body of said heat sink.

23. Cooling apparatus for removing heat from a plurality of heat dissipating electronic components mounted in a given pattern to a first circuit board having a plurality of other components mounted thereon, said first circuit board configured for insertion into a backplane of a computer cabinet, said cabinet including an air moving device for drawing cooling air into said cabinet and removing spent air from said cabinet, said apparatus comprising:
a first baffle member in spaced relation to said circuit board and having a plurality of openings arranged in said given pattern;
pocket means coacting with said openings, said pocket means being formed by wall means substantially about the periphery of said heat dissipating electronic components, said wall means substantially thermally isolating each of said heat dissipating components, one from the other;
a second baffle member in spaced relation to said first baffle member with the space therebetween defining an exhaust plenum;
a plurality of nozzle means affixed to said second baffle member for permitting passage of air therethrough, said nozzle means being arranged in said pattern for indexing and alignment with said heat dissipating electronic components; and
other means in spaced relation to said second baffle member for defining an inlet plenum for directing cooling air through said nozzle means to said heat dissipating electronic components for removing heat therefrom and from said pocket means and for exhausting spent air through said exhaust plenum.

24. Cooling apparatus as recited in claim 23 wherein said backplane is configured for receiving a second circuit board adjacent to said first circuit board, and wherein said other means is aid second circuit board.

25. Cooling apparatus as recited in claim 23 wherein said nozzle means includes a multi-jet nozzle array having a plurality of nozzles.

26. Cooling apparatus as recited in claim 25 wherein the majority of nozzles of said multi-jet nozzle array are a given diameter.

27. Cooling apparatus as recited in claim 26 wherein said multi-jet array is spaced at a predetermined distance from said heat dissipating electronic components which distance is less than said given diameter.

28. Cooling apparatus as recited in claim 23 wherein said heat dissipating electronic components include an integrated circuit with heat sink means mounted thereon and wherein said nozzle means terminate in proximate spaced relation to said heat sink means.

29. Cooling apparatus as recited in claim 28 wherein said heat sink means includes a body and a plurality of pin-like fins emanating from said body toward said nozzle means.

30. Cooling apparatus as recited in claim 29 wherein said wall means terminate in abutting relation with said first circuit board.

31. Cooling apparatus as recited in claim 29 wherein said wall means terminate in spaced relation to said first circuit board at a distance no greater than the distance between said first circuit board and the interface of said heat sink means with said integrated circuit.

32. Cooling apparatus for removing heat from a plurality of heat dissipating electronic component mounted to a first circuit board having a plurality of other components mounted thereon, said first circuit board configured for insertion into a backplane of a computer cabinet adjacent a second circuit board having components thereon mounted on a side facing away from said first circuit board, said cabinet including an air moving device for drawing cooling air into said cabinet and removing spent air from said cabinet, said apparatus comprising:
air inlet plenum means formed at least in part by said second circuit board;
air exhaust plenum means adjacent said inlet plenum means and formed, at least in part, by said exhaust plenum means;
pocket means in said exhaust plenum means formed by wall means substantially about the periphery of said heat dissipating electronic components, said wall means substantially thermally isolating each of said dissipating components, one from the other; and
means in said inlet plenum means for directing cooling air therethrough for impingement on said heat dissipating electronic components for removing heat therefrom and from said pocket means and for exhaust spent air through said exhaust plenum means.

33. Cooling apparatus as recited in claim 32 wherein said means in said inlet plenum means includes nozzle means.

34. Cooling apparatus as recited in claim 33 wherein the outlet of said nozzle means terminates in spaced proximate relation to said heat dissipating electronic components.

35. Cooling apparatus as recited in claim 34 wherein said nozzle means includes a multi-jet nozzle array for each of said heat dissipating electronic components.

* * * * *